US005695572A

United States Patent [19]

Brunner et al.

[11] Patent Number: 5,695,572
[45] Date of Patent: Dec. 9, 1997

[54] CLEANING AGENT AND METHOD FOR CLEANING SEMICONDUCTOR WAFERS

[75] Inventors: Roland Brunner, Reut; Georg Hochgesang, Burghausen; Anton Schnegg, Burghausen; Gertraud Thalhammer, Burghausen, all of Germany

[73] Assignee: Wacker Siltronic Gesellschaft für Halbleitermaterialien Aktiengesellschaft, Burghausen, Germany

[21] Appl. No.: 513,271

[22] Filed: Aug. 10, 1995

[30] Foreign Application Priority Data

Aug. 25, 1994 [DE] Germany ............... 44 30 217.7
Apr. 24, 1995 [DE] Germany ............... 195 15 024.4

[51] Int. Cl.⁶ .................................................. B08B 3/00
[52] U.S. Cl. ........................... 134/3; 134/2; 134/26; 134/28; 134/29
[58] Field of Search ..................... 134/2, 3, 26, 28, 134/27, 29

[56] References Cited

U.S. PATENT DOCUMENTS

| | | | |
|---|---|---|---|
| 3,915,633 | 10/1975 | Ramachandran | 134/3 |
| 4,009,299 | 2/1977 | Flowers et al. | 437/225 |
| 4,014,715 | 3/1977 | Preston | 134/3 |
| 4,376,057 | 3/1983 | Angelo et al. | 252/79.4 |
| 4,714,517 | 12/1987 | Malladi et al. | 216/34 |
| 4,795,582 | 1/1989 | Ohmi et al. | 252/79.3 |
| 5,061,393 | 10/1991 | Linares et al. | 252/143 |
| 5,397,397 | 3/1995 | Awad | 134/1 |

FOREIGN PATENT DOCUMENTS

| | | |
|---|---|---|
| 0095171 | 11/1983 | European Pat. Off. |
| 4209865 | 9/1993 | Germany. |
| 59-196385 | 11/1984 | Japan. |

OTHER PUBLICATIONS

Antilla et al. Metal Contamination Removal on Silicon Wafers using Dilute Acidic Solutions, J. Electrochem. Soc. V. 139, No. 6, Jun. 1992, pp. 1751–1756.

Database WPI, Section Ch, Week 8451 Derwent Publications Ltd., London, GB; AN 84–314862 & JP-A-59196385 (Shinko Denki KK), Nov. 7, 1984.

Derwent Abstract for German DE 4209865, Sep. 1993.

Werner Kern, David A. Puotinen, RCA Review, vol. 31, pp. 187–206, (1970).

P.H. Singer, Semiconductor International, pp. 36–39 (Dec. 1992).

W.C. Krusell and D.I. Golland, Proc. Electrochem. Soc., pp. 23–32 (1990).

*Primary Examiner*—Robert J. Warden
*Assistant Examiner*—Alexander Markoff
*Attorney, Agent, or Firm*—Collard & Roe, P.C.

[57] ABSTRACT

A cleaning agent and method are useful for cleaning semiconductor wafers. The aqueous cleaning agent has a pH of 1 to 5, preferably a pH of 1 to 3, and contains at least one surfactant and at least one compound which belongs to a group of compounds comprising succinic acid and its derivatives. To clean the semiconductor wafers, a thin film of cleaning agent is generated on the side faces of the semiconductor wafers, preferably using a mechanical tool.

14 Claims, No Drawings

CLEANING AGENT AND METHOD FOR CLEANING SEMICONDUCTOR WAFERS

BACKGROUND OF THE INVENTION

1. Field of the Invention

The present invention relates to a cleaning agent and a method for cleaning semiconductor wafers. The objective of the method is to remove contaminants from the wafer surface. The term contaminants is to be understood as meaning, in particular, foreign metals, organic compounds and particles having diameters in the region of less than 1 μm.

2. The Prior Art

A cleaning method which has long been known and is often used is the so-called RCA cleaning (W. Kern and D. A. Puotinen, RCA Review, vol. 31, pages 187–206 (1970)). Permanent components of this method are two cleaning baths in which the semiconductor wafers are first treated with an aqueous liquid referred to as SC1 solution and then with an aqueous liquid referred to as SC2 solution. While the SC1 solution is a solution of hydrogen peroxide and ammonium hydroxide whose oxidative and alkaline nature is responsible for the removal of particles and organic residues, it is mainly foreign metals which are removed from the surfaces of the treated semiconductor wafers by the SC2 solution, which is based on dilute hydrochloric acid and hydrogen peroxide. A disadvantage of the two-stage RCA cleaning is that, although the SC1 solution substantially frees the surfaces of semiconductor wafers from particles, it is at the same time an additional source of the contamination of the semiconductor wafers with foreign metals such as iron, zinc and aluminum. Although the measurable concentration of foreign metals on the wafer surfaces is likewise markedly reduced by the subsequent treatment with SC2 solution, the number of particles adhering to the wafer surfaces increases again as a result of this treatment (P. H. Singer in Semiconductor International, pages 36–39 (Dec. 1992)).

Various methods of cleaning semiconductor wafers assist the removal of contaminants by introducing energy, for example in the form of soundwaves ("megasonic and ultrasonic cleaning") (or in the form of kinetic energy ("scrubber method")), into a cleaning bath containing semiconductor wafers. In the so-called "scrubber method", a vigorously flowing film of cleaning agent which is capable of very effectively stripping superficially adhering particles is generated, for example, by means of a series of rollers on the side faces of semiconductor wafers (W. C. Krusell and D. I. Golland, Proc. Electrochem. Soc., pages 23–32 (1990)).

SUMMARY OF THE INVENTION

It is an object of the present invention to provide a cleaning agent and a method for cleaning semiconductor wafers, which cleaning agent and method are suitable for effectively removing contaminants on the surfaces of semiconductor wafers.

The above object is achieved according to the present invention by an aqueous cleaning agent for cleaning semiconductor wafers, wherein the cleaning agent contains at least one surfactant and at least one compound which belongs to a group of compounds comprising succinic acid and its derivatives, and has a pH of 1 to 5, preferably a pH of 1 to 3. Furthermore, the above object is achieved by a method according to the invention by generating a film of this aqueous cleaning agent on the side faces of semiconductor wafers.

The cleaning agent and the method are particularly suitable for cleaning semiconductor wafers composed of silicon.

Semiconductor wafers have to be cleaned repeatedly in the course of their production. Normally, any mechanical or chemical treatment of the wafer surfaces is concluded with a cleaning step. For example, a wafer cleaning is just as necessary after the lapping as after the chemical etching or after the polishing. The RCA cleaning described above generally serves to clean polished semiconductor wafers. In principle, any cleaning step which becomes necessary in the course of the production of semiconductor wafers can be carried out with a cleaning agent of the present invention. It is preferable, .however, to use the cleaning agent for cleaning polished semiconductor wafers. Particularly good cleaning results can be achieved if polished semiconductor wafers are pretreated with an SC1 solution or an SC1 solution and an SC2 solution and finally cleaned with the cleaning agent according to the invention.

The semiconductor wafers may be immersed in a bath of the cleaning agent for the purpose of cleaning. It is preferable, however, to assist the cleaning of the semiconductor wafers by supplying kinetic energy to the cleaning agent. It is particularly preferable to use the "scrubber method" for this purpose or to move one or more plastics-material rollers parallel to the side face of the wafer in the presence of the cleaning agent. The semiconductor wafer is not stressed mechanically if the cloth distributes the cleaning agent to form a thin film flowing over the side face of the wafers.

In addition to water, the cleaning agent contains at least one surfactant and at least one compound selected from a group of compounds consisting of succinic acid and its derivatives. Furthermore, the cleaning agent has a pH of 1 to 5, preferably a pH of 1 to 3. Optionally, the cleaning agent also contains hydrochloric acid in an amount ranging from 0.0% to 1%, preferably from 0.01% to 1.0% by weight based upon the total solution weight. The hydrochloric acid may be used, for example, to adjust the pH of the cleaning agent.

The aqueous cleaning agent solution preferably contains from 0.01% to 1% by weight of the surfactant component based upon the total solution weight. Particularly preferable are cleaning agents which contain 0.01% to 0.1% by weight of surfactant based upon the total solution weight. Individual surfactant compounds or mixtures of surfactants may be used as the surfactant. Preferred are anionic, amphoteric or nonionic surfactants which generate a neutral or slightly acidic pH in aqueous solution. Particularly preferred surfactants are ethoxylated alkylphenols and alkyl polyglycol ether sulfates.

The cleaning agent also contains one or more compounds selected from a group of compounds to which succinic acid and its derivatives belong. Members of this group which are preferred include succinic acid, sulfosuccinic acid and their monoester and diester derivatives. Succinic acid ($HOOCCH_2CH_2COOH$) and/or sulfosuccinic acid ($HOOCCH_2CH(SO_3H)COOH$) are particularly preferred. The concentration of this component within the cleaning agent solution is preferably 0.001% to 1.0% by weight based upon the total solution weight, particularly preferably from 0.01% to 0.1% by weight based upon the total solution weight.

Optionally, the cleaning agent may contain a further substance component which has metal-complexing properties. Ferritin is particularly well suited to this purpose, as well as a chelating agent sold under the trademark ERICHROME BLACK T®.

The balance of the aqueous solution up to 100% by weight based upon the total solution weight is water.

Thus, an example of a cleaning agent solution according to the invention is a composition comprising from 0.01% to 1.0% by weight of the surfactant; from 0.001% to 1.0% by weight of the succinic acid compound, from 0.0% to 1.0% by weight of hydrochloric acid; and from 97.0% to 99.99% by weight of water, with all weight % based upon the total solution weight.

The efficiency of the cleaning agent is demonstrated in the comparison of the examples below.

Other objects and features of the present invention will become apparent from the following examples considered in connection with the accompanying detailed description of preferred embodiments which discloses several embodiments of the present invention. It should be understood, however, that the examples are designed for the purpose of illustration only and not as a definition of the limits of the invention.

EXAMPLES

Fifty polished silicon wafers having a diameter of 150 mm were first subjected to a standard RCA cleaning. In the case of half of these wafers, their surfaces were then examined for contaminants (Comparison Examples 1 and 2). The other half of the wafers were finally cleaned with cleaning agents according to the invention. The aqueous cleaning agent solution according to Example 1 contained 0.05% by weight of nonylphenol/ethylene oxide adduct and 0.05% by weight of sulfosuccinic acid and had been adjusted to a pH of 2 with concentrated hydrochloric acid (0.01% by weight). The aqueous cleaning agent solution according to Example 2 had a pH of 2 and contained 0.03% by weight of nonylphenol/ethylene oxide adduct and 0.5% by weight of sulfosuccinic acid, but no hydrochloric acid.

The final cleaning of the silicon wafers was carried out by the standard "scrubber method". The residual contaminant level was then also measured in the case of these wafers (Examples 1 and 2).

To analyze the particles, a commercial particle counter was used. Using this instrument, the particles were counted and divided into three types as a function of their mean diameter. Foreign metals on the surface of the silicon wafers were detected by VPD/TXRF measurement (vapor phase decomposition/total reflection X-ray fluorescence), with the exception of the metals sodium and aluminum, which were measured by VPD/AAS (vapor phase decomposition/atomic absorption spectroscopy).

The results of the measurements are summarized in the following tables:

a) Particle Measurement:

|  | 0.1 μm*) | 0.2 μm*) | 0.3 μm*) |
|---|---|---|---|
| Comparison Example 1 | 564**) | 79**) | 6.2**) |
| Example 1 | 525**) | 72**) | 4.2**) |
| Comparison Example 2 | 40**) | 5**) | 4.0**) |
| Example 2 | 40) | 4.0) | 4.0**) | b) Foreign-metal measurement***):

|  | K | Ca | Fe | Ni |
|---|---|---|---|---|
| Comparison Example 1 | $1 \cdot 10^9$ | $1 \cdot 10^9$ | $1 \cdot 10^9$ | $1 \cdot 10^9$ |
| Example 1 | $<1 \cdot 10^8$ | $<1 \cdot 10^8$ | $<1 \cdot 10^8$ | $<1 \cdot 10^8$ |
| Comparison Example 2****) | $<1 \cdot 10^{10}$ | $1 \cdot 10^{10}$ | $3 \cdot 10^9$ | $<1 \cdot 10^9$ |
| Example 2****) | $<1 \cdot 10^{10}$ | $<8.5 \cdot 10^9$ | $<1 \cdot 10^9$ | $<1 \cdot 10^9$ |

|  | Cu | Zn | Al | Na |
|---|---|---|---|---|
| Comparison Example 1 | $3 \cdot 10^9$ | $4 \cdot 10^9$ | $8 \cdot 10^{10}$ | $3 \cdot 10^{10}$ |
| Example 1 | $<1 \cdot 10^8$ | $3 \cdot 10^8$ | $2 \cdot 10^{10}$ | $<2.2 \cdot 10^{10}$ |
| Comparison Example 2****) | $8 \cdot 10^9$ | $1 \cdot 10^{10}$ | $2.5 \cdot 10^{10}$ | $2.4 \cdot 10^{10}$ |
| Example 2****) | $6 \cdot 10^9$ | $<1 \cdot 10^9$ | $<1.4 \cdot 10^{10}$ | $3 \cdot 10^{10}$ |

*) Particle sizes classified in three ranges: <0.1 μm; from 0.1 to <0.2 μm; from 0.2 to <0.3 μm.
**) Mean number of particles found per wafer
***) All the numerical data are in the unit [atoms/cm$^2$] and are arithmetic mean values of the results of the measurements on the wafers of a test series.
****) Limit of detection associated with the equipment modified compared with Comparison Example 1 and Example 1.

While several embodiments of the present invention have been shown and described, it is to be understood that many changes and modifications may be made thereunto without departing from the spirit and scope of the invention as defined in the appended claims.

What is claimed is:

1. A method for cleaning polished semiconductor wafers, comprising the steps of providing polished semiconductor wafers having side faces;

precleaning of said polished semiconductor wafers with an aqueous alkaline cleaning solution; and final cleaning of said polished semiconductor wafers by generating a film of an aqueous cleaning agent solution on the side faces of said polished semiconductor wafers, the cleaning agent for said final cleaning containing at least one surfactant and at least one compound selected from the group consisting of succinic acid and the derivatives of succinic acid, and having a pH of 1 to 5.

2. The method as claimed in claim 1, comprising generating said film with the aid of a mechanical tool.

3. The method as claimed in claim 1, wherein the cleaning agent contains a compound selected from the group consisting of succinic acid and sulfosuccinic acid, and the mixtures thereof.

4. The method as claimed in claim 1, wherein the cleaning agent additionally contains hydrochloric acid.

5. The method as claimed in claim 1, wherein the cleaning agent solution comprises from 0.01% to 1.0% by weight of the surfactant;

from 0.001% to 1.0% by weight of the succinic acid compound;

from 0.0% to 1.0% by weight of hydrochloric acid; and from 97.0% to 99.99% by weight of water, with all weight % based upon the total solution weight.

6. The method as claimed in claim 1, wherein the compound is succinic acid.

7. The method as claimed in claim 1, wherein the compound is sulfosuccinic acid.

8. A method for cleaning polished semiconductor wafers comprising the steps of providing polished semiconductor wafers having side faces;

precleaning of said polished semiconductor wafers in a first cleaning step with an aqueous alkaline cleaning solution and in a second cleaning step with an aqueous acidic cleaning solution; and final cleaning of said polished semiconductor wafers by generating a film of an aqueous cleaning agent solution on the side faces of said polished semiconductor wafers, the cleaning agent of said final cleaning containing at least one surfactant and at least one compound selected from the group consisting of succinic acid and the derivatives of succinic acid, and having a pH of 1 to 5.

9. The method as claimed in claim 8, comprising generating said film with the aid of a mechanical tool.

10. The method as claimed in claim 8, wherein the cleaning agent contains a compound selected from the group consisting of succinic acid and sulfosuccinic acid, and the mixtures thereof.

11. The method as claimed in claim 8, wherein the cleaning agent additionally contains hydrochloric acid.

12. The method as claimed in claim 8, wherein the cleaning agent solution comprises from 0.01% to 1.0% by weight of the surfactant;

from 0.001% to 1.0% by weight of the succinic acid compound;

from 0.0% to 1.0% by weight of hydrochloric acid; and from 97.0% to 99.99% by weight of water, with all weight % based upon the total solution weight.

13. The method as claimed in claim 8, wherein the compound is succinic acid.

14. The method as claimed in claim 8, wherein the compound is sulfosuccinic acid.

* * * * *